United States Patent [19]

Shen

[11] Patent Number: 5,384,689
[45] Date of Patent: Jan. 24, 1995

[54] INTEGRATED CIRCUIT CHIP INCLUDING SUPERIMPOSED UPPER AND LOWER PRINTED CIRCUIT BOARDS

[76] Inventor: Ming-Tung Shen, No. 60, Lane 328, Li-Shan St., Nei-Hu Dist., Taipei City, Taiwan Prov. of China

[21] Appl. No.: 170,473

[22] Filed: Dec. 20, 1993

[51] Int. Cl.[6] .................................................. H05K 1/18
[52] U.S. Cl. .................................. 361/761; 257/678; 257/686; 361/728; 361/790; 361/792; 361/807
[58] Field of Search ................. 29/827; 174/253, 255, 174/260, 52.1–52.4; 257/666, 668, 676, 678, 679, 684, 685, –688, 700, 723, 724, 784; 361/728, 736, 684, 737, 760, 761, 763, 764, 776, 807, 809, 811, 812, 735, 744; 439/68, 69, 70, 74; 235/1 D, 492, 495

[56] References Cited

U.S. PATENT DOCUMENTS

| | | | |
|---|---|---|---|
| 4,288,841 | 9/1981 | Gogal | 174/52.4 |
| 4,996,587 | 2/1991 | Hinrichsmeyer et al. | 257/686 |
| 5,128,831 | 7/1992 | Fox, III et al. | 361/744 |
| 5,205,032 | 4/1993 | Kuroda et al. | 361/761 |
| 5,231,305 | 7/1993 | Russell | 257/678 |

FOREIGN PATENT DOCUMENTS

| | | | |
|---|---|---|---|
| 52-117551 | 3/1977 | Japan | 257/784 |
| 58-178529 | 10/1983 | Japan | 257/676 |
| 59-193596 | 11/1984 | Japan | 361/737 |
| 62-273759 | 11/1987 | Japan | 257/784 |
| 2-229461 | 9/1990 | Japan | 257/686 |
| 5-29373 | 2/1993 | Japan | 257/784 |
| 623183 | 5/1981 | Switzerland | 361/761 |

OTHER PUBLICATIONS

Research Disclosure "Organic Card Device Carrier" No. 313 May 1990.

Primary Examiner—Leo P. Picard
Assistant Examiner—Donald A. Sparks
Attorney, Agent, or Firm—Panitch Schwarze Jacobs & Nadel

[57] ABSTRACT

An integrated circuit chip includes a printed circuit board unit, a die and a plurality of conductive wires. The printed circuit board unit has a top surface, a plurality of conductive strips that is provided on the top surface, and a die-receiving cavity that is formed therewith. The cavity is accessible via the top surface. The die has an upper surface and a plurality of solder pads that is formed on the upper surface. The die is received in the die-receiving cavity of the printed circuit board unit such that the solder pads are exposed at the top surface of the printed circuit board unit. The conductive wires interconnect the solder pads of the die and the conductive strips of the printed circuit board unit.

3 Claims, 7 Drawing Sheets ing cavity of the printed circuit board unit such that the solder pads are exposed at the top surface of the printed circuit board unit. The conductive wires interconnect the solder pads of the die and the conductive strips of the printed circuit board unit.

INTEGRATED CIRCUIT CHIP INCLUDING SUPERIMPOSED UPPER AND LOWER PRINTED CIRCUIT BOARDS

BACKGROUND OF THE INVENTION

1. Field of the Invention

This invention relates to an integrated circuit chip, more particularly to an integrated circuit chip which can be manufactured at a lower cost within a shorter production time.

2. Description of the Related Art

FIG. 1 shows a die 20 which is adapted to be mounted on a lead frame (not shown) and which has a plurality of solder pads 40 formed at two sides of an upper surface thereof. At the central portion of the upper surface of the die 20, a circuit area 10 is provided. The pads 40 are connected electrically to circuit tracks (not shown) in the circuit area 10. Having fixed the die 20 on the lead frame, conventional wire bonding techniques are employed to connect electrically the solders pads 40 on the die 20 to the leads (not shown) of the lead frame. Referring now to FIG. 2, each of the aluminum wires 30 extends upward from the pads 40 and then downward to the leads so that the first end of each wire 30 can be connected electrically to a corresponding solder pad 40 while the second end of the same can be connected electrically to a corresponding lead. A layer of protective PV film (not shown) is then applied on the upper surface of the die 20. Lastly, the die 20 and the lead frame are packaged in a plastic package to form an integrated circuit chip. Note that damage to the film layer can occur because of the high temperature present during the packaging operation.

Referring now to FIG. 3, another type of die (20A) has a plurality of solder pads 50 formed at a central portion of an upper surface thereof. At two sides of the central portion of the upper surface of the die (20A), circuit areas 10 are provided. The pads 50 are connected electrically to circuit tracks (not shown) in the circuit areas 10. The die (20A) shown in FIG. 3 is also adapted to be mounted on a lead frame (not shown) and similarly undergoes conventional wire bonding techniques. However, referring to FIG. 4, since the distance between one pad 50 and the corresponding edges of the die (20A) is larger when compared to that of the die 20 in FIG. 2, and since the film layer is easily damaged during the packaging operation, the wires 30 may come into contact with the die (20A), thereby resulting in a short circuit condition. Furthermore, the inclusion of the packaging operation increases the production time, the manufacturing cost and the size of the integrated circuit chip.

SUMMARY OF THE INVENTION

Therefore, the main object of the present invention is to provide an integrated circuit chip which can overcome the aforementioned problems.

According to this invention, an integrated circuit chip includes a printed circuit board unit including superimposed upper and lower printed circuit boards, a die and a plurality of conductive wires. The printed circuit board unit has a top surface, a plurality of conductive strips that are provided on the top surface, and a die-receiving cavity that is formed thereon. The cavity is accessible via the top surface. The die has an upper surface and a plurality of solder pads that are formed on the upper surface. The die is received in the die-receiv-

BRIEF DESCRIPTION OF THE DRAWINGS

Other features and advantages of the present invention will become apparent in the following detailed description of the preferred embodiments, with reference to the accompanying drawings, of which.

DETAILED DESCRIPTION OF THE PREFERRED EMBODIMENT

Figure 1:
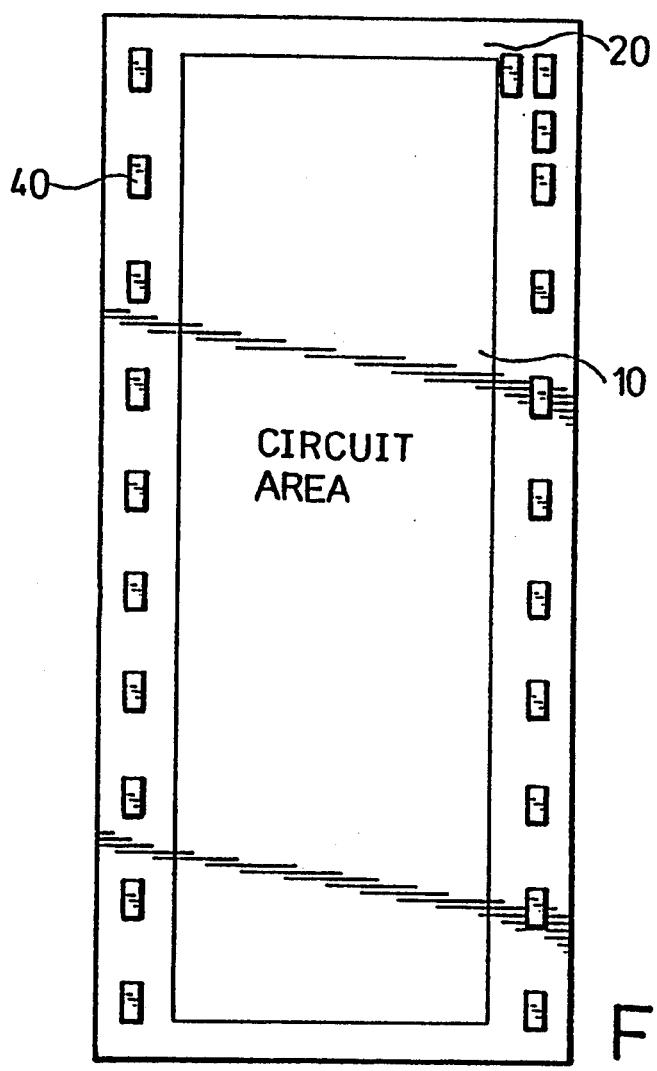
FIG. 1 is a schematic view of a conventional die.
Figure 2:
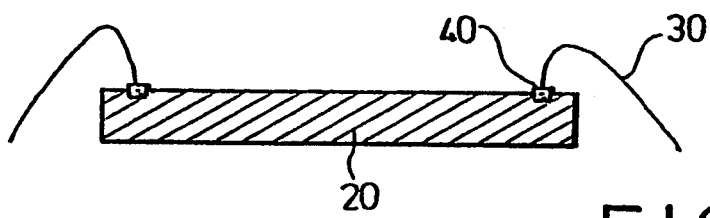
FIG. 2 is a side view of the die shown in FIG. 1 after it has undergone a conventional wire bonding technique.
Figure 3:
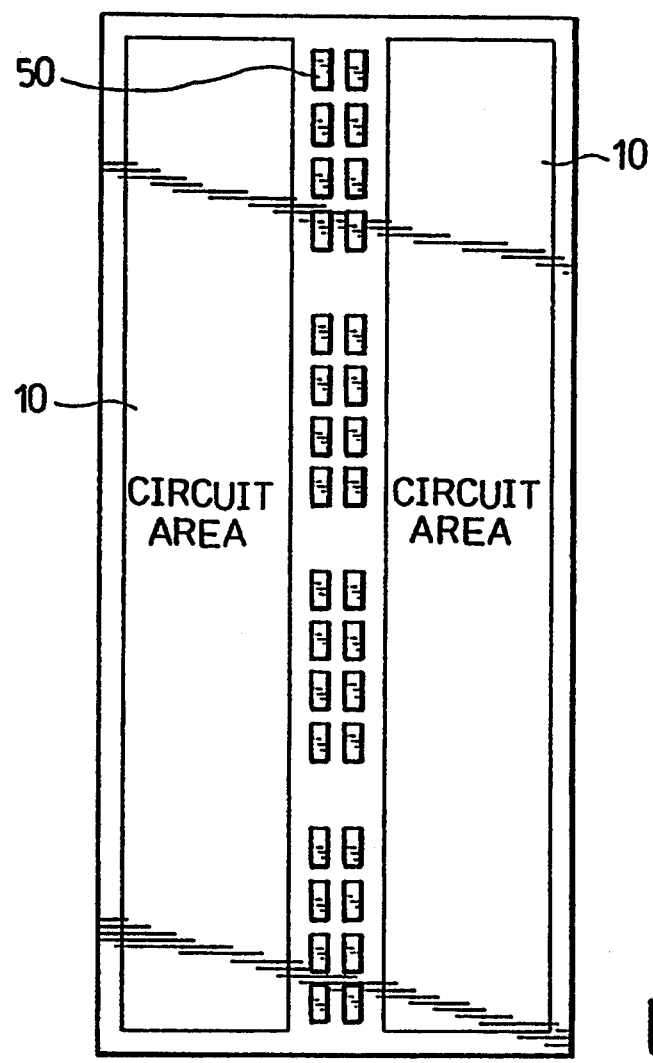
FIG. 3 is a schematic view of another conventional die.
Figure 4:
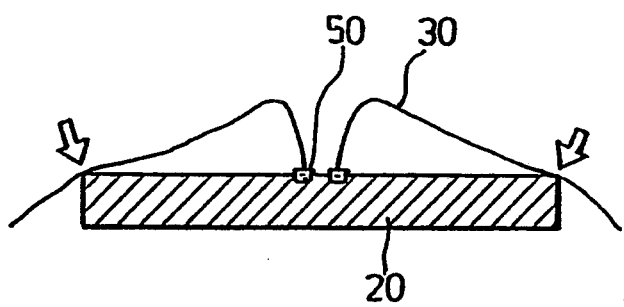
FIG. 4 is a side view of the die shown in FIG. 3 after it has undergone a conventional wire bonding technique.

Before the present invention is described in greater detail, it should be noted that like elements are indicated by the same reference numerals throughout the disclosure.

Figure 5:
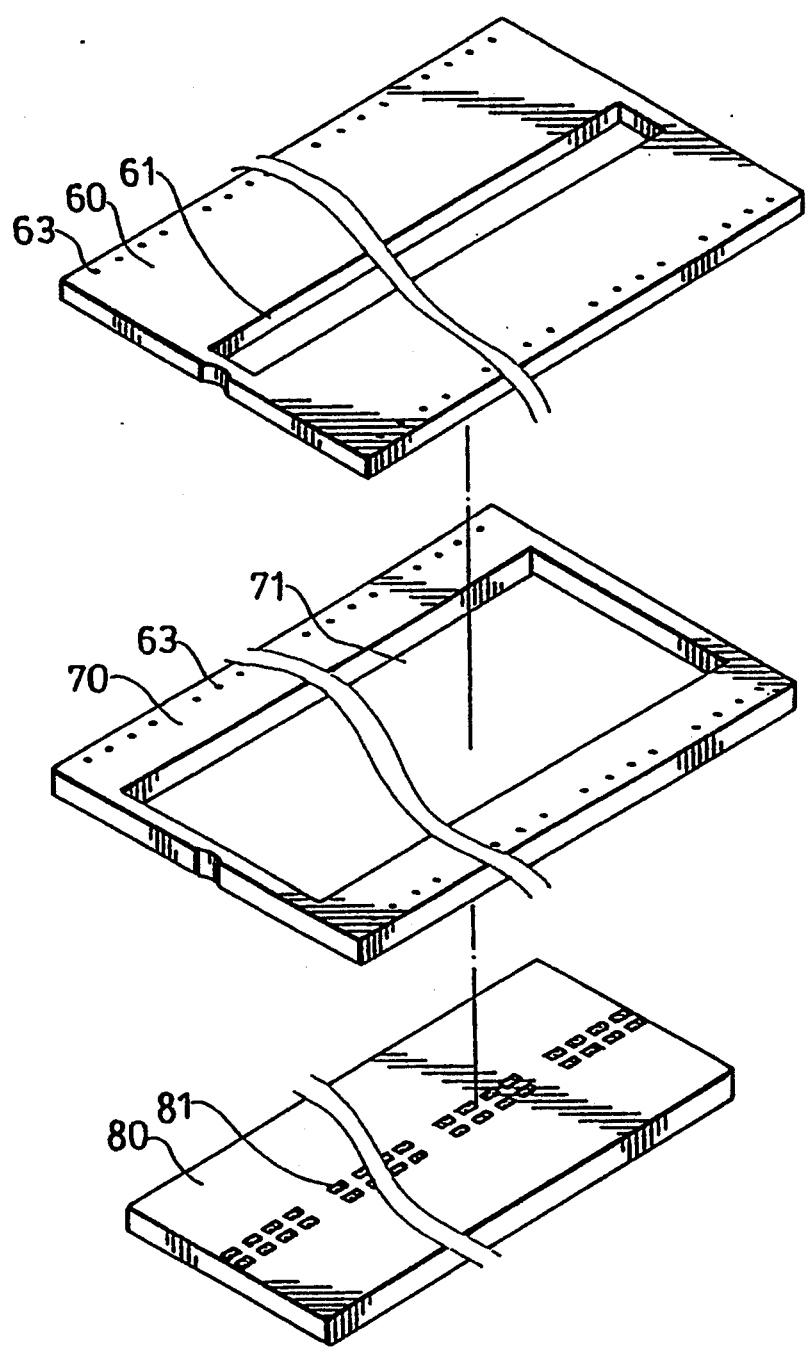
FIG. 5 is an exploded view showing an integrated circuit chip according to the first embodiment of the present invention.
Figure 7:
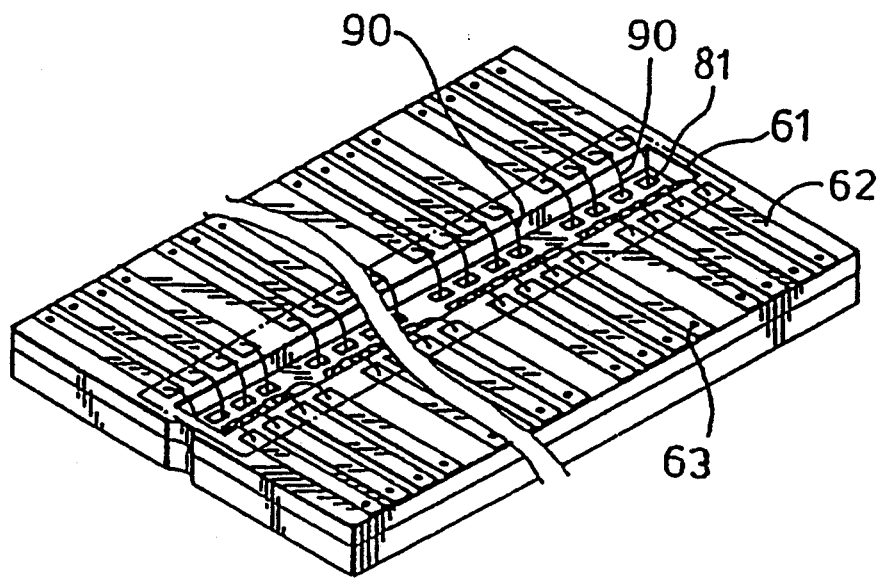
FIG. 7 is a perspective view showing the integrated circuit chip shown in FIG. 6.
Figure 6:
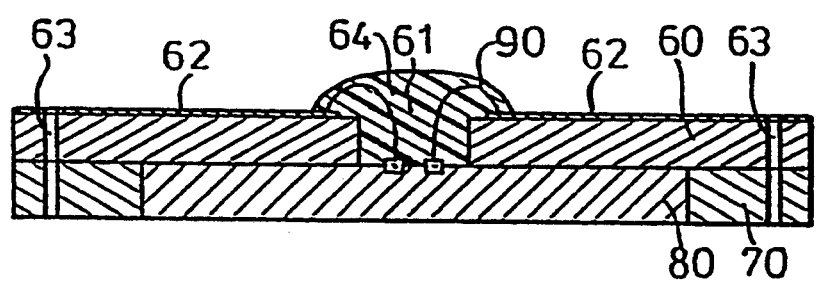
FIG. 6 is a sectional view showing the assembled integrated circuit chip according to the first embodiment of the present invention after undergoing a conventional wire bonding technique.

Referring to FIGS. 5, 6 and 7, an integrated circuit chip according to a first embodiment of the present invention comprises a printed circuit board unit including an upper printed circuit board 60 and a lower printed circuit board 70, a die 80 and a plurality of aluminum wires 90.

The upper printed circuit board 60 has a top surface, a bottom surface, and a bore 61 formed therethrough. A plurality of conductive strips 62 are formed on the top surface of the upper printed circuit board 60.

The lower printed circuit board 70 has a hole 71 formed therethrough, an inner peripheral wall that confines the hole 71 and a bottom surface. The upper printed circuit board 60 is superimposed on the lower printed circuit 70 in such a manner that the bottom surface of the upper printed circuit board 60 and the inner peripheral wall of the lower printed circuit board 70 cooperatively define a die-receiving cavity. The cavity is accessible via the bore 61 of the upper printed circuit board 60. The upper and lower printed circuit boards 60,70 are connected to each other by means of a conventional method, such as with the use of adhesives.

The die 80 has a plurality of solder pads 81 formed on an upper surface thereof and is received in the die-receiving cavity. A lower surface of the die is substantially flush with the bottom surface of the lower printed circuit board 70. The bore 61 of the upper printed circuit board 60 exposes the pads 81 on the upper surface of the die 80.

The conductive wires 90 have first ends connected electrically to the strips 62 and second ends which extend into the cavity via the bore 61 and which are connected electrically to the pads 81 of the die 80.

The upper and lower printed circuit boards 60, 70 may also have a plurality of plated-through holes 63 formed therethrough. The plated-through holes 63 are used for electrical connection between electrical tracks (not shown) of the upper and lower printed circuit boards 60,70 and for electrical connection to another printed circuit board (not shown) by conventional surface mounting techniques. The top surface of the upper printed circuit board 60 may be provided with a plastic protective layer 64, such as epoxy resin, at the bore 61 so as to cover the solder pads 81 and portions of the aluminum wires 90 that are adjacent to the die 80 for die protecting purposes. For the purpose of clarity, such protective layer is shown in phantom lines in FIG. 7.

Because the upper surface of the die 80 is disposed lower than the top surface of the upper printed circuit board 60, contact between the aluminum wires 90 and the die 80 may be prevented. Furthermore, since the integrated circuit chip of the present invention does not require a lead frame or a plastic package, the integrated circuit chip is smaller and can be manufactured at a lower cost within a shorter production time.

Figure 8:
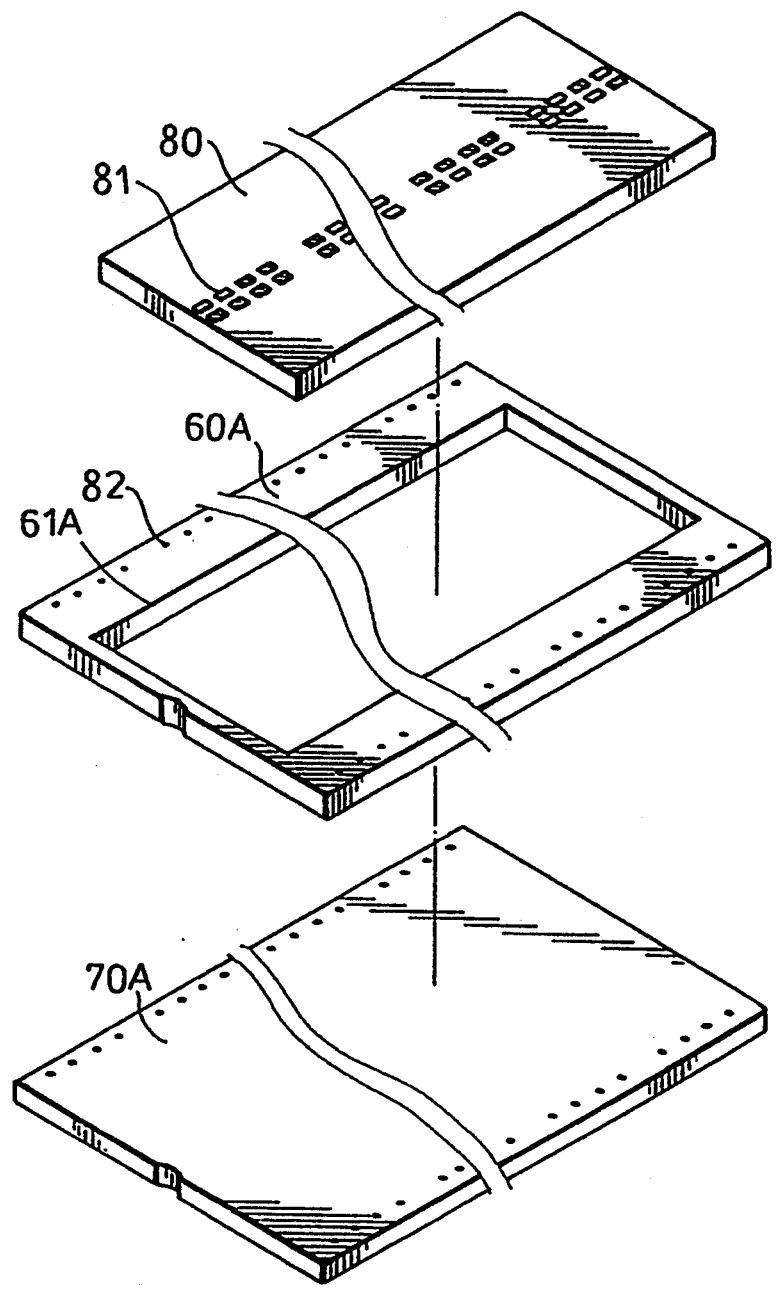
FIG. 8 is an exploded view of an integrated circuit according to a second embodiment of the present.
Figure 9:
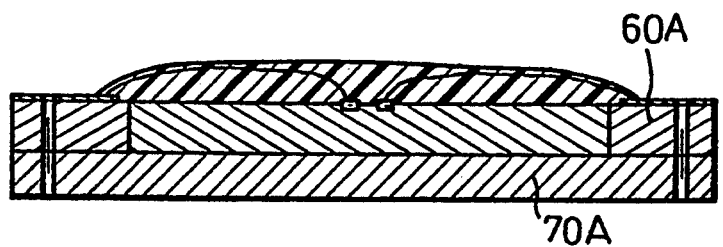
FIG. 9 is a sectional view showing the assembled integrated circuit chip according to the second embodiment of the present invention after undergoing a conventional wire bonding technique.
Figure 10:
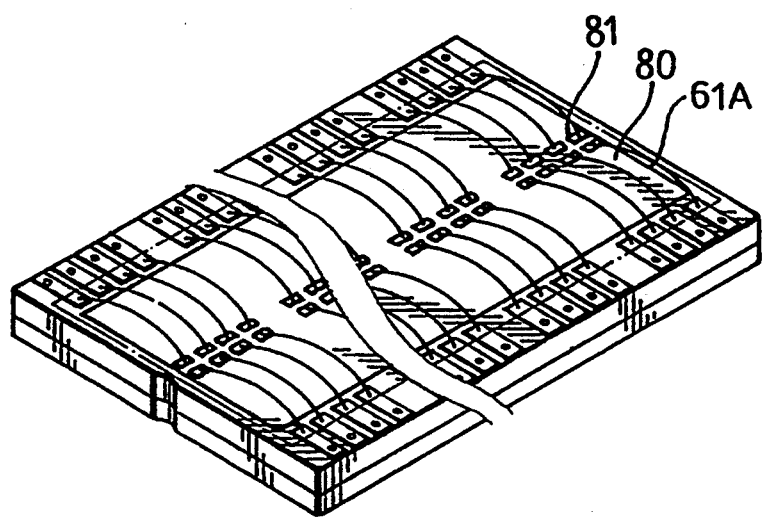
FIG. 10 is a perspective view showing the integrated circuit chip shown in FIG. 9.

Referring now to FIGS. 8, 9 and 10, a second embodiment of the present invention is shown. The printed circuit board unit of the second embodiment includes an upper printed circuit board (60A) and a lower printed circuit board (70A). The upper printed circuit board (60A) has a hole (61A) formed therethrough, and an inner peripheral wall that defines the hole (61A). The lower printed circuit board (70A) has a top surface. The upper printed circuit board (60A) is superimposed on the lower printed circuit board (70A) in such a manner that the inner peripheral wall of the upper printed circuit board (60A) and the top surface of the lower printed circuit board (70A) cooperatively define the die-receiving cavity in which the die (80) is received. The die (80) has a top surface which is substantially flush with the top surface of the upper printed circuit board (60A). Since the upper surface of the die 80 is substantially flush with the top surface of the upper printed circuit board (60A), contact between the aluminum wires 90 and the die 80 is also prevented.

Figure 11:
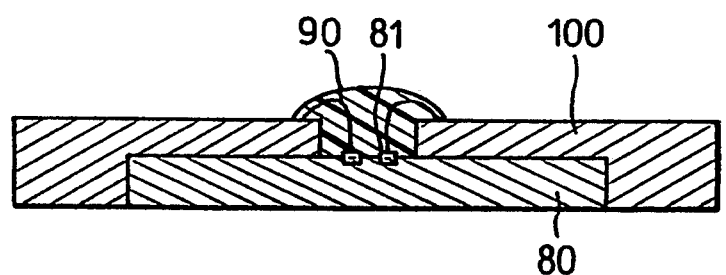
FIG. 11 is a sectional view of an integrated circuit chip according to a third embodiment of the present invention.

Referring now to FIG. 11, a third embodiment of the present invention is shown. Unlike the first and second embodiments, the printed circuit board unit includes only one printed circuit board 100. The printed circuit board 100 has a top surface and a bottom surface in which the die-receiving cavity is formed. The printed circuit board 100 further has a bore 110 which is formed in the top surface to access the die-receiving cavity and expose the pads 81 on the upper surface of the die 80.

The die 80 has a lower surface which is substantially flush with the bottom surface of the printed circuit board 100. The conductive wires 90 have first ends connected electrically to the strips (not shown) on the top surface of the circuit board 100 and second ends which extend into the cavity via the bore 110 and which are connected electrically to the pads 81 of the die 80.

Figure 12:
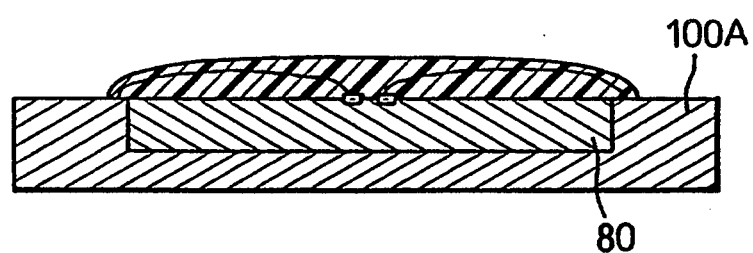
FIG. 12 is a sectional view of an integrated circuit chip according to a fourth embodiment of the present invention.

Referring now to FIG. 12, a fourth embodiment is shown. Unlike the third embodiment, the printed circuit board unit includes a printed circuit board (100A) having a top surface in which the die-receiving cavity is formed. The upper surface of the die 80 is substantially flush with the top surface of the printed circuit board (100A).

While the present invention has been described in connection with what is considered the most practical and preferred embodiments, it is understood that this invention is not limited to the disclosed embodiments, but is intended to cover various arrangements included within the spirit and scope of the broadest interpretation so as to encompass all such modifications and equivalent arrangements.

I claim:

1. An integrated circuit chip comprising:
   a printed circuit board unit having a top surface, a plurality of conductive strips provided on said top surface, and a die-receiving cavity formed thereon, said cavity being accessible via said top surface;
   a die having an upper surface and a plurality of solder pads formed on said upper surface, said die being received in said die-receiving cavity of said printed circuit board unit such that said solder pads are exposed at said top surface of said printed circuit board unit; and
   a plurality of conductive wires interconnecting said solder pads of said die and said conductive strips of said printed circuit board unit wherein said printed circuit board unit includes superimposed upper and lower printed circuit boards, said upper printed circuit board having a top surface which serves as said top surface of said printed circuit board unit, and a bottom surface, said lower printed circuit board having a hole formed therethrough and being mounted to said upper printed circuit board, said lower printed circuit board further having an inner peripheral wall which confines said hole and a bottom surface, said bottom surface of said upper printed circuit board and said inner peripheral wall of said lower printed circuit board cooperatively defining said die-receiving cavity, said die having a lower surface which is substantially flush with said bottom surface of said lower printed circuit board, said upper printed circuit board further having a bore formed therethrough to access said cavity and expose said pads on said upper surface of said die, said conductive wires having first ends connected electrically to said strips and second ends which extend into said cavity via said bore and which are connected electrically to said pads of said die.

2. An integrated circuit chip as claimed in claim 1, further comprising a plastic protective layer provided on said top surface of said printed circuit board unit to cover said solder pads and portions of said wires adjacent to said die.

3. An integrated circuit chip as claimed in claim 1, wherein said conductive wires are aluminum wires.

* * * * *